(12) United States Patent
Sinha et al.

(10) Patent No.: US 10,333,485 B2
(45) Date of Patent: Jun. 25, 2019

(54) MATCHING NETWORKS FOR WIRELESS POWER TRANSFER AND RELATED TECHNIQUES

(71) Applicant: The Regents of the University of Colorado, a body corporate, Denver, CO (US)

(72) Inventors: Sreyam Sinha, Boulder, CO (US); Ashish Kumar, Boulder, CO (US); Khurram K. Afridi, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 171 days.

(21) Appl. No.: 15/633,668

(22) Filed: Jun. 26, 2017

(65) Prior Publication Data
US 2017/0373660 A1    Dec. 28, 2017

Related U.S. Application Data

(60) Provisional application No. 62/354,796, filed on Jun. 26, 2016, provisional application No. 62/450,495, filed on Jan. 25, 2017.

(51) Int. Cl.
| | |
|---|---|
| *H03H 7/38* | (2006.01) |
| *H02J 50/10* | (2016.01) |
| *H02J 50/05* | (2016.01) |
| *H03H 7/40* | (2006.01) |

(52) U.S. Cl.
CPC ............... *H03H 7/40* (2013.01); *H02J 50/05* (2016.02); *H02J 50/10* (2016.02); *H03H 7/38* (2013.01); *H03H 2260/00* (2013.01)

(58) Field of Classification Search
CPC ........ H03F 1/56; H03F 1/565; H03F 1/45071; H03F 2200/243; H03F 2200/246; H03F 2200/267; H03F 2200/318; H03H 7/004; H03H 7/03; H03H 7/1741; H03H 7/06; H03H 7/07; H03H 7/175; H03H 7/1783; H03H 7/38; H03H 7/383; H03H 9/145
See application file for complete search history.

(56) References Cited

U.S. PATENT DOCUMENTS

| | | | | |
|---|---|---|---|---|
| 6,489,861 B2* | 12/2002 | Noguchi | .............. | H03H 9/6483 333/133 |
| 6,658,265 B1* | 12/2003 | Steel | ....................... | H03F 3/191 455/552.1 |
| 9,923,530 B2* | 3/2018 | Kao | .......................... | H03F 3/19 |

* cited by examiner

*Primary Examiner* — An T Luu
(74) *Attorney, Agent, or Firm* — FisherBroyles, LLP; Thomas J. Osborne, Jr.

(57) ABSTRACT

In one implementation, an analytical approach to determining an improved and/or optimal design of a matching network in a capacitive or inductive WPT system is provided. In one implementation, for example, a framework is provided to enable stage(s) of the network to simultaneously provide gain and compensation. The multistage matching network efficiency can be improved and/or optimized, such as by using the method of Lagrange multipliers, resulting in the optimum distribution of gain and compensation among the L-section stages.

24 Claims, 16 Drawing Sheets

MATCHING NETWORKS FOR WIRELESS POWER TRANSFER AND RELATED TECHNIQUES

CROSS-REFERENCE TO RELATED APPLICATIONS

This application claims the benefit of U.S. provisional application No. 62/354,796, filed Jun. 26, 2016 entitled "Hybrid Feedforward Control, Efficient Matching Networks and Combinations Thereof" and U.S. provisional patent application No. 62/450,495 filed on Jan. 25, 2017 entitled "Wireless Power Transfer, Matching Networks and Related Techniques," each of which is hereby incorporated by reference as though fully set forth herein.

GOVERNMENT LICENSE RIGHTS

This invention was made with government support under DE-AR0000618 awarded by the U.S. Department of Energy and NSF-1554293 awarded by the U.S. National Science Foundation. The government has certain rights in the invention.

BACKGROUND a. Field

The present disclosure relates to multistage matching networks for wireless power transfer (WPT) systems.

b. Background

Current approaches to wireless power transfer (WPT) mostly rely on inductive coupling between coils to transfer energy across an air-gap. Inductive WPT systems have undergone extensive research but still face numerous challenges, including the high cost, large size, and high-frequency losses associated with ferrite cores. An attractive alternative is capacitive WPT, which relies on electrically coupled metal plates for power transfer. In contrast to inductive WPT systems, capacitive WPT systems do not require ferrites and can be operated efficiently at high frequencies, thereby enabling reduced cost and size. Capacitive WPT systems have been reported for a variety of applications, including recent work on electric vehicle (EV) charging. Designing capacitive WPT systems for EV charging is particularly challenging, owing to the requirement of high power transfer across large air-gaps. To limit fringing electric fields near the coupling plates in compliance with safety regulations, the voltage across the air-gap needs to be limited. This necessitates the employment of appropriate voltage and current gain networks to limit the displacement current through the air-gap while also transferring the required power. Additionally, the large air-gap results in a large capacitive reactance, which must be compensated to ensure effective and efficient power transfer. Multistage matching networks can be used to provide this required gain and compensation simultaneously.

BRIEF SUMMARY

In one implementation, an analytical approach to determining an improved and/or optimal design of a matching network in a capacitive or inductive WPT system is provided. In one implementation, a framework is provided to enable stage(s) of the network to simultaneously provide gain and compensation. The multistage matching network efficiency can be improved and/or optimized, such as by using the method of Lagrange multipliers, resulting in the optimum distribution of gain and compensation among the L-section stages. This approach has been validated using an exhaustive-search based numerical optimization as well as experiment.

The foregoing and other aspects, features, details, utilities, and advantages of the present invention will be apparent from reading the following description and claims, and from reviewing the accompanying drawings.

DETAILED DESCRIPTION

High-power large air-gap capacitive wireless power transfer (WPT) systems, for example, may require circuit stages that provide large voltage or current gain and reactive compensation. Multistage matching networks can provide these gains and compensation simultaneously.

An analytical approach to improve and/or optimize the design of multistage L-section matching networks in a capacitive WPT system, which maximizes the matching network efficiency, is provided. A new framework is provided to enable each L-section stage of the multistage networks to simultaneously provide gain and compensation. The multistage matching network efficiency is improved and/or optimized, such as by using the method of Lagrange multipliers, resulting in the optimum distribution of gain and compensation among the L-section stages. This approach has been validated using an exhaustive-search based numerical optimization as well as experiment.

In one particular implementation, for example, the approach can maximize the matching network efficiency using the method of Lagrange multipliers and identify the optimal distribution of gains and compensations among the L-section stages. The results of the proposed approach are validated using an exhaustive-search based numerical optimization for 6.78-MHz, 2-kW capacitive WPT system. A 6.78-MHz, 15-W prototype comprising a two-stage matching network is designed using the proposed analytical approach and the theoretical predictions have been experimentally validated.

Although the proposed approach is generally described in the context of capacitive WPT systems, it is equally applicable to inductive WPT systems, with two modifications: (1) the reactance of the inductive coupler, which the multistage networks need to compensate for, is positive; and (2) it may be more appropriate to utilize a current gain network on the primary side of the inductive coupler, and a voltage gain network on the secondary side of the inductive coupler.

Figure 1A:
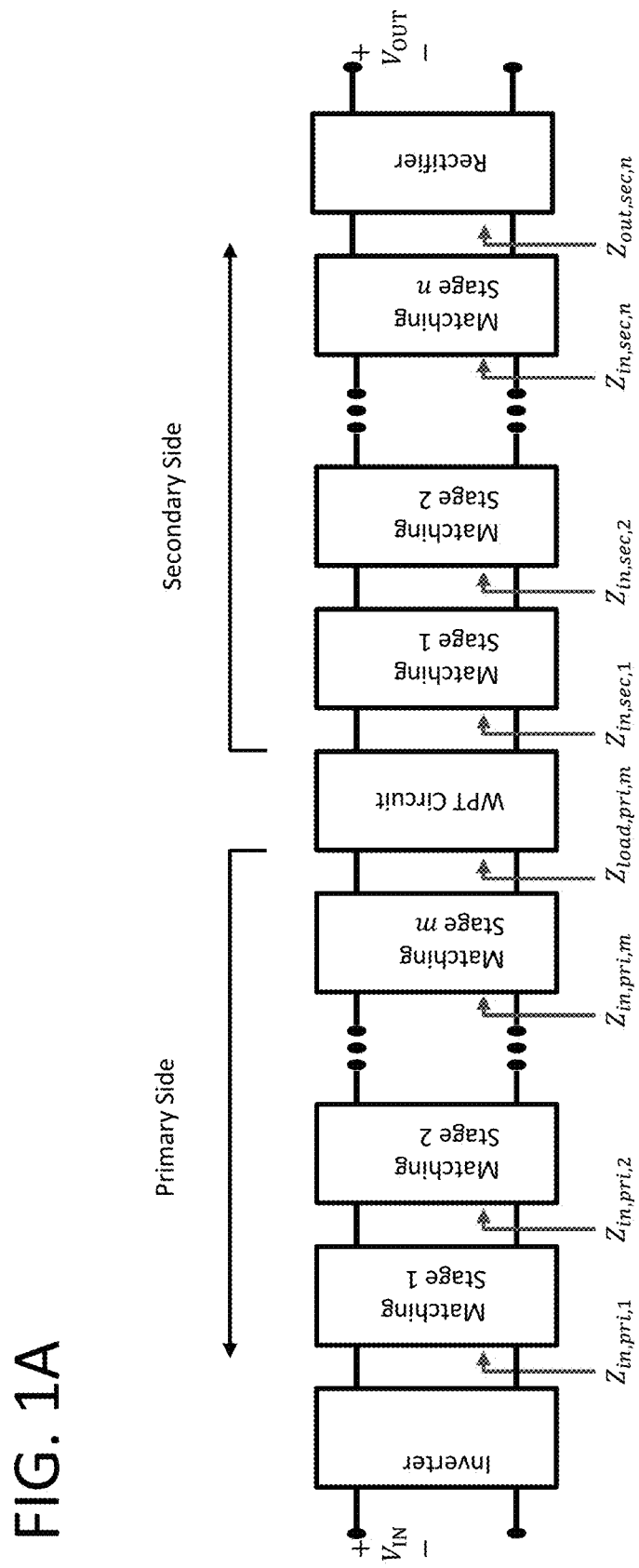
FIG. 1A shows a schematic diagram of an example wireless power transfer (WPT) system using multistage matching networks to provide gain and compensation, according to one or more embodiments described and shown herein.
Figure 1B:
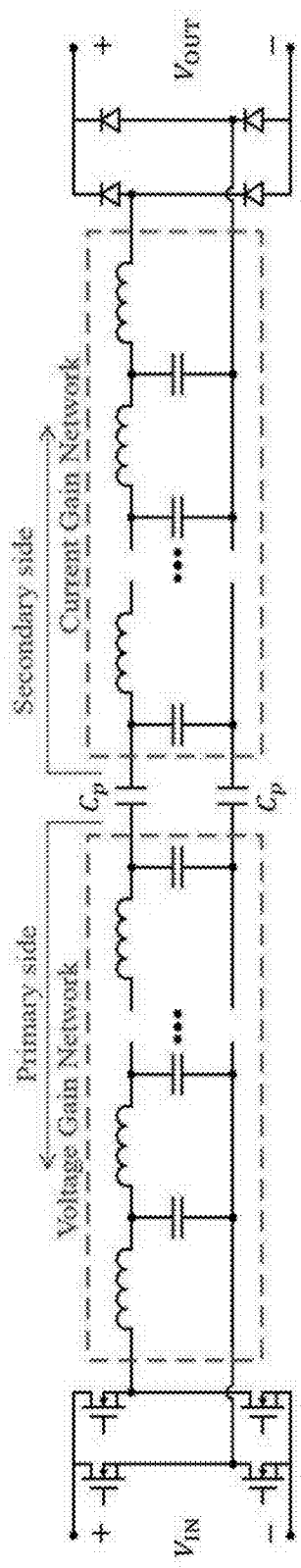
FIG. 1B shows a schematic diagram of an example capacitive WPT system using L-section multistage matching networks, according to one or more embodiments described and shown herein.

Multistage Matching Networks for Gain and Compensation in Capacitive WPT Systems The general architecture of an example WPT system utilizing multistage matching networks to provide gain and compensation is shown in FIG. 1A. Among the basic matching network topologies, L-section matching networks are typically the most efficient for a given gain. A capacitive WPT system with multistage L-section matching networks is shown in FIG. 1B. Wireless power transfer in this system is achieved using two pairs of conducting plates ($C_p$) separated by air-gaps. An inverter converts the dc input voltage into high-frequency ac, which is fed into a multistage matching network that steps up the voltage. This creates a high voltage at the primary side of the coupling plates, enabling high power transfer with low displacement current across the plates, and hence relatively low plate voltages and fringing fields. The voltage gain network also partially compensates the capacitive reactance of the coupling plates. The plates are followed by a second multistage matching network that steps the current back up to the level required at the output. This network also provides the remaining compensation for the plate reactance. A high-frequency rectifier interfaces the system to the load, which in the case of EV charging is the vehicle battery.

Although FIGS. 1A and 1B show WPT systems with multistage matching networks on both the primary and secondary sides of a WPT circuit, other implementations may also include one or more single stage matching network coupled to the primary and/or secondary side of the WPT circuit of FIGS. 1A and 1B.

In a conventional approach to designing multistage matching networks described in Y. Han and D. J. Perreault, "Analysis and Design of High Efficiency Matching Networks," *IEEE Transactions on Power Electronics*, vol. 21, no. 5, pp. 1484-1491, September 2006, each L-section stage of the network is designed to have a purely resistive load and purely resistive input impedance. Such an L-section stage can provide voltage or current gain, but cannot provide compensation. Therefore, the conventional approach cannot to be utilized to design the matching networks of the capacitive WPT system of FIG. 1B, where both gain and compensation are required. A new framework for designing multistage L-section matching networks was introduced in A. Kumar, S. Sinha, A. Sepahvand and K. K. Afridi, "Improved Design Optimization for High-Efficiency Matching Networks," *IEEE Transactions on Power Electronics*, February 2017, available online (herein, Kumar et al.), which is incorporated by reference herein in its entirety, in which each L-section stage is allowed to have complex input and load impedances, as shown in FIGS. 2(a)-2(d) for the four types of L-section stages, such as may be utilized in a capacitive WPT system, such as the system shown in FIG. 1B. This framework enables the L-section stages of a multistage network to be designed to provide both gain and compensation. However, the design approach and results of Kumar et al. only apply to multistage networks whose overall input impedance and overall load impedance are both resistive. Since the two multistage networks of the capacitive WPT system of FIG. 1B together need to provide compensation for the reactance of the coupling plates, the load impedance of the voltage gain network (on the primary side) and/or the input impedance of the current gain network (on the secondary side) must be complex. Therefore, the design approach of Kumar et al. is not directly applicable to the capacitive WPT system of FIG. 1B. As described in more detail herein, the complex impedance framework of Kumar et al. is leveraged, while a new approach to optimally designing multistage matching networks that can provide both gain and compensation in capacitive WPT systems is also provided.

Although the design approach is described above in the context of example L-section stages, it can also be utilized for T or pi type stages, as these can be constructed by cascading L-section stages. For instance, the L-section stages of FIGS. 2(a) and 2(c) can be cascaded to form a T stage, and the L-section stages of FIGS. 2(d) and 2(b) can be cascaded to form a pi stage.

To characterize an L-section stage of a multistage matching network, three quantities are introduced in Kumar et al.: $G_i$, the current gain provided by the L-section stage, defined as $$G_i = \frac{|\hat{I}_{out}|}{|\hat{I}_{in}|},$$

where $|I_{out}|$ and $|\hat{I}_{in}|$ are the amplitudes of the output and input currents of the stage, respectively; $Q_{load}$, the load impedance characteristic of the L-section stage, defined $$Q_{load} = \frac{X_{load}}{R_{load}},$$

where $X_{load}$ and $R_{load}$ are the imaginary and real parts of the load impedance of the stage, respectively; and $Q_{in}$, the input impedance characteristic of the L-section stage, defined as $$Q_{in} \overset{def}{=} \frac{X_{in}}{R_{in}},$$

where $X_{in}$ and $R_{in}$ are the imaginary and real parts of the input impedance of the stage, respectively. Note that while $G_i$ is a measure of the gain, $Q_{in}$ and $Q_{load}$ are measures of the compensation provided by the L-section stage. Given required values of $G_i$, $Q_{load}$, $Q_{in}$ and $R_{load}$ for each L-section stage of the voltage gain network of the capacitive WPT system of FIG. 1B, the inductance and capacitance values of the stage can be determined using the following expressions:

$$L = \frac{Q_{in}G_i^2 R_{load} + G_i\sqrt{(1-G_i^2)R_{load}^2 + Q_{load}^2 R_{load}^2}}{2\pi f_s}, \quad (1)$$

$$C = \frac{1-G_i^2}{2\pi f_s \left(G_i\sqrt{(1-G_i^2)R_{load}^2 + Q_{load}^2 R_{load}^2} - G_i^2 Q_{load} R_{load}\right)}.$$

Here, $f_s$ is the operating frequency of the capacitive WPT system. Similarly, the expressions for required inductance and capacitance values for each L-section stage of the current gain network shown in FIG. 1B are given by:

$$L = \frac{G_i\sqrt{(G_i^2-1)R_{load}^2 + Q_{in}^2 G_i^2 R_{load}^2} - Q_{load} R_{load}}{2\pi f_s}, \quad (2)$$

$$C = \frac{G_i^2 - 1}{2\pi f_s \left(Q_{in}G_i^2 R_{load} + G_i^2\sqrt{(G_i^2-1)R_{load}^2 + Q_{in}^2 G_i^2 R_{load}^2}\right)}.$$

Design Optimization of Multistage Matching Networks in Capacitive WPT Systems

In one example, an optimization approach is provided that can determine the distribution of gains ($G_i$'s) and compensation characteristics ($Q_{in}$'s and $Q_{load}$'s) among the different stages of the multistage voltage gain and current gain networks of the capacitive WPT system of FIG. 1B so as to improve and/or maximize their overall efficiency. The first step in this approach is to express the efficiency of an L-section stage in terms of its current gain and compensation characteristics. Neglecting capacitor losses—since inductor losses dominate in most systems of practical interest—and assuming that the L-section stage is highly efficient, its efficiency can be approximated as:

$$\eta_k \approx 1 - \frac{Q_{eff,k}}{Q_L}. \quad (3)$$

Here $Q_L$ is the inductor quality factor, and $Q_{eff,k}$ is an effective transformation factor associated with the k-th L-section stage of the multistage network. $Q_{eff,k}$ encapsulates both the gain and compensation characteristics of the stage. Expressions for this transformation factor for the L-section stages of the voltage gain and current gain networks of the capacitive WPT system of FIG. 1B are listed in Table I, and their derivations are provided in Kumar et al.

TABLE I

EXPRESSIONS FOR THE EFFECTIVE TRANSFORMATION FACTOR $Q_{eff}$ FOR THE L-SECTION STAGES OF FIG. 2

Figure 2A:
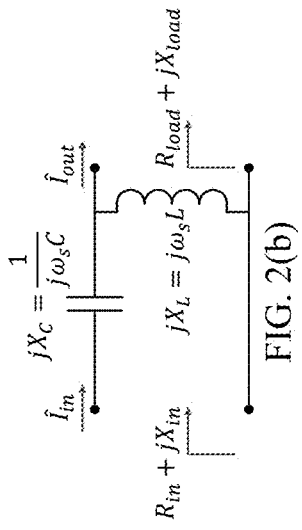
FIGS. 2(a) through 2(d) show schematic diagrams of four example L-section matching network stages, according to one or more embodiments described and shown herein.
Figure 2C:
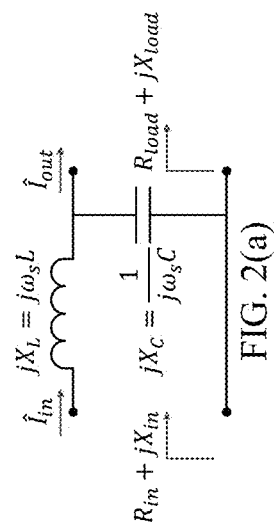
Figure 2B:
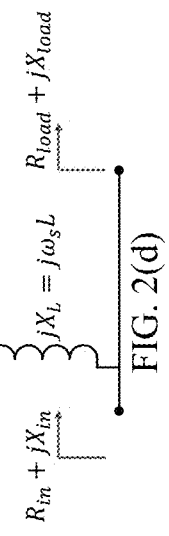
Figure 2D:
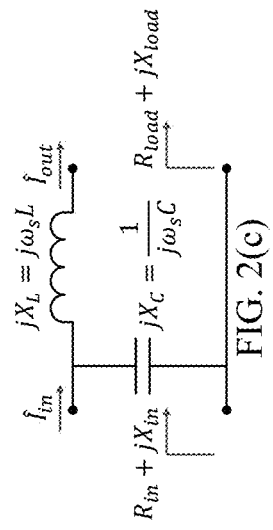

| L-section Stage Type | Expression for $Q_{eff}$ |
|---|---|
| Voltage gain (FIG. 2(a)) | $\frac{1}{G_i}\sqrt{1 - G_i^2 + Q_{load}^2} + Q_{in}$ |
| Current gain (FIG. 2(c)) | $G_i\sqrt{1 - \frac{1}{G_i^2} + Q_{in}^2} - Q_{load}$ |

Consider the capacitive WPT system of FIG. 1B with m L-section stages in its voltage gain network, and n L-section stages in its current gain network. Using (3), and applying the high-efficiency assumption (that is, $Q_{eff,k} \ll Q_L$ for all the stages), the efficiency the m-stage voltage gain network, $\eta_{VG}$, and the n-stage current gain network, $\eta_{CG}$, can be expressed as:

$$\eta_{VG} \approx 1 - \frac{\sum_{p=1}^{m} Q_{eff,p,VG}}{Q_L}, \quad (4a)$$

$$\eta_{CG} \approx 1 - \frac{\sum_{q=1}^{n} Q_{eff,q,CG}}{Q_L}. \quad (4b)$$

Here, $Q_{eff,p,VG}$ and $Q_{eff,q,CG}$ are the effective transformation factors of the p-th and q-th stages of the multistage voltage gain network and the multistage current gain network, respectively. The overall efficiency of this m-n multistage matching network system is given by:

$$\eta_{multistage,m-n} \approx 1 - \frac{\sum_{p=1}^{m} Q_{eff,p,VG} + \sum_{q=1}^{n} Q_{eff,q,CG}}{Q_L}. \quad (6)$$

Figure 3:
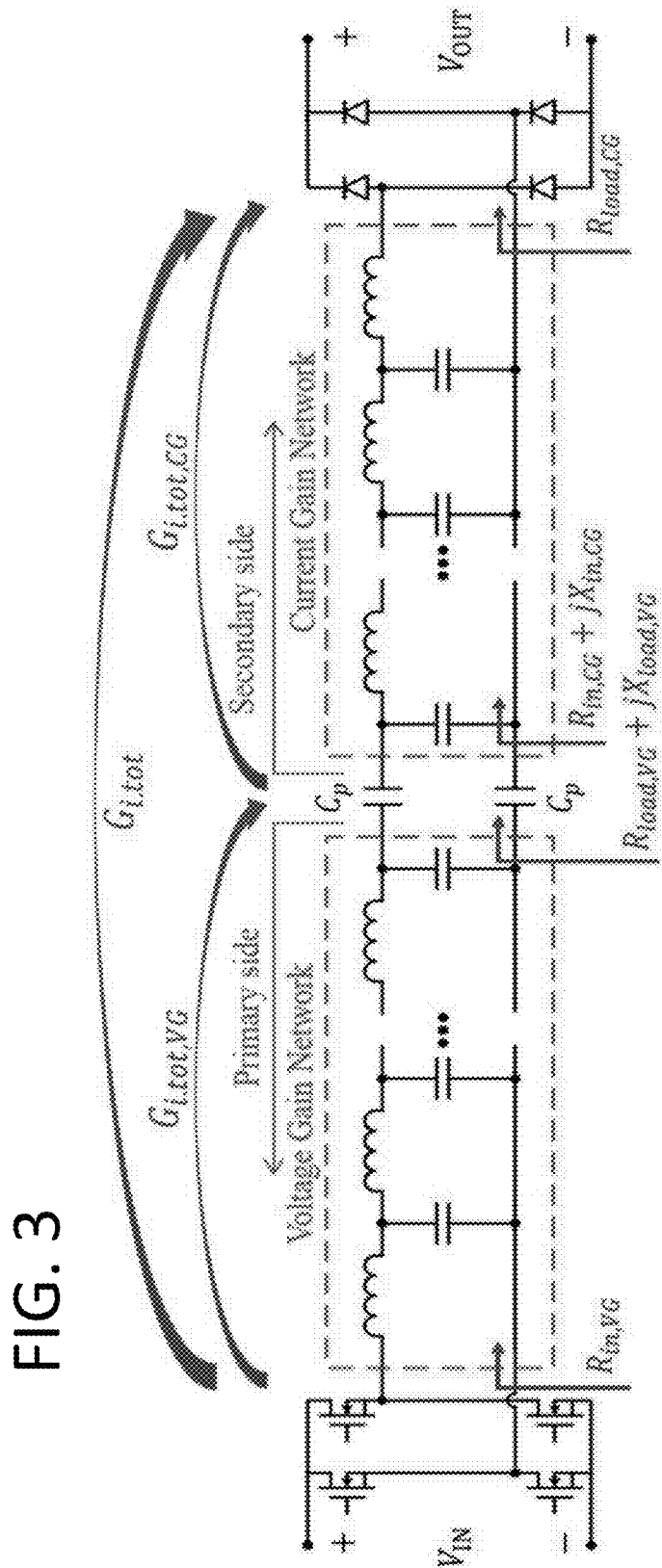
FIG. 3 shows a schematic diagram of an example capacitive WPT system using a voltage gain matching network coupled to a primary side of a capacitive WPT circuit and a current gain matching network coupled to a secondary side of the capacitive WPT circuit, according to one or more embodiments described and shown herein.

It is apparent from the form of (6) that maximizing the overall matching network efficiency $\eta_{multistage,m-n}$ is equivalent to minimizing the sum of the effective transformation factors of all the stages, $\sum_{p=1}^{m} Q_{eff,p,VG} + \sum_{q=1}^{n} Q_{eff,q,CG}$. This minimization is bound by four constraints, which are illustrated for the capacitive WPT system of FIG. 1B in FIG. 3. Firstly, the required total current gain of the capacitive WPT system, denoted by $G_{i,tot}$ in FIG. 3, is constrained by the specified input and output voltages and output power of the capacitive WPT system. This total current gain $G_{i,tot}$ is the product of the current gain provided by the voltage gain network, $G_{i,tot,VG}$, and the current gain provided by the current gain network, $G_{i,tot,CG}$, both of which are also shown in FIG. 3. Secondly, the input impedance of the first L-section stage of the voltage gain network is constrained to be resistive (shown as $R_{in,1,VG}$ in FIG. 3). This constraint is imposed since the input impedance of the first stage of the voltage gain network, which is the same as the loading impedance of the inverter in FIG. 3, must be near-resistive (and slightly inductive) to achieve soft-switching of the inverter transistors in the form of zero-voltage and near-zero-current switching. Thirdly, the load impedance of the last stage of the current gain network, which is the same as the input impedance of the rectifier, is also constrained to be resistive (shown as $R_{load,n,CG}$ in FIG. 3), since the class-D rectifier of FIG. 3 behaves like a near-resistive (and slightly capacitive) load. Finally, the load impedance characteristic of the last stage of the voltage gain network, $Q_{load,m,VG}$, and the input impedance characteristic of the first stage of the current gain network, $Q_{in,1,CG}$, are related to one another by the reactance of the coupling plates of the capacitive WPT system, $$X_p\left(=-\frac{1}{2\pi f_s C_p}\right).$$

With these constraints, the optimization problem can be formally expressed as:

$$\min(\Sigma_{p=1}^m Q_{\it{eff,p,VG}} + \Sigma_{q=1}^n Q_{\it{eff,q,CG}}), \quad (7a)$$

subject to:

$$\prod_{p=1}^m G_{i,p,VG} \prod_{q=1}^n G_{i,q,CG} = G_{i,tot,VG} G_{i,tot,CG} = G_{i,tot}, \quad (7b)$$

$$Q_{in,1,VG} = 0,$$

$$Q_{load,n,CG} = 0.$$

$$Q_{load,m,VG} - Q_{in,1,CG} = \frac{4X_p P_{OUT} G_{i,tot,VG}^2}{k_{inv}^2 V_{IN}^2}.$$

Here, $X_p$ is the reactance of each pair of coupling plates, $V_{IN}$ and $R_{OUT}$ are the dc input voltage and rated output power of the system, respectively, and $k_{inv}$ is a voltage gain associated with the inverter, which is equal to $$\frac{4}{\pi}$$

for the full-bridge inverter shown in FIG. 3; $G_{i,p,VG}$ is the current gain provided by the p-th stage and $Q_{in,1,VG}$ is the input impedance characteristic of the first stage of the voltage gain network; $G_{i,q,CG}$ is the current gain provided by the q-th stage and $Q_{load,n,CG}$ is the load impedance characteristic of the last (n-th) stage of the current gain network. To solve this optimization problem, the method of Lagrange multipliers is employed, utilizing the following Lagrangian:

$$\mathcal{L} = \left(\sum_{p=1}^m Q_{\it{eff,p,VG}} + \sum_{q=1}^n Q_{\it{eff,q,CG}}\right) + \quad (8)$$

-continued $$\lambda_1\left(\prod_{p=1}^m G_{i,p,VG}\prod_{q=1}^n G_{i,q,CG} - G_{i,tot}\right) + \lambda_2 Q_{in,1,VG} +$$

$$\lambda_3 Q_{load,n,CG} + \lambda_4\left(Q_{load,m,VG} - Q_{in,1,CG} - \frac{4X_p P_{OUT} G_{i,tot,VG}^2}{k_{inv}^2 V_{IN}^2}\right).$$

Here, $\lambda_1$, $\lambda_2$, $\lambda_3$ and $\lambda_4$ are Lagrange multipliers. The expression in (7a) is minimized subject to the constraints given in (7b) by setting the partial derivatives of the Lagrangian in (8) with respect to the gain and compensation characteristics of each L-section stage ($G_i$, $Q_{in}$ and ($Q_{load}$) to zero. This results in relationships between the gains and compensation characteristics of the stages that maximize the overall matching network efficiency.

The optimization results depend on the number of stages utilized in the voltage gain and current gain networks. For designs having multistage voltage and current gain networks, that is, m>1 and n>1, the optimal current gains ($G_i$'s) provided by the first m−1 stages of the voltage gain network are equal (denoted by $G_{i,eq,VG}$), that is:

$$G_{i,1,VG} = G_{i,2,VG} = \ldots = G_{i,m-1,VG} \triangleq G_{i,eq,VG}, \quad (9)$$

Analogously for the current gain network, the optimal current gains of the last n−1 stages are equal (denoted by $G_{i,eq,CG}$), that is:

$$G_{i,n,CG} = G_{i,n-1,CG} = \ldots = G_{i,2,CG} \triangleq G_{i,eq,CG}, \quad (10)$$

The optimal equal current gain $G_{i,eq,VG}$ of the first m−1 stages of the voltage gain network can be found by solving the following equation:

$$\left(\frac{4|X_p|P_{OUT}}{k_{inv}^2 V_{IN}^2}\right)^2 G_{i,tot}^2 G_{i,eq,VG}^{2(m+n-1)} = \quad (11)$$

$$(G_{i,eq,VG}^2 + 1)^2\left(\frac{4|X_p|P_{OUT}}{k_{inv}^2 V_{IN}^2} G_{i,tot} G_{i,eq,VG}^{m+n-2} - 1\right).$$

The optimal current gain of the last (m-th) stage of the voltage gain network can then be obtained from:

$$G_{i,m,VG} = \frac{k_{inv} V_{IN}}{2 G_{i,eq,VG}^{m-1}} \sqrt{\frac{1}{|X_p|P_{OUT}}\left(\frac{G_{i,eq,VG}^{m-n}}{G_{i,tot}} + \frac{G_{i,tot}}{G_{i,eq,VG}^{m-n}}\right)}. \quad (12)$$

Furthermore, the optimal equal current gain $G_{i,eq,CG}$ of the last n−1 stages of the current gain network comes out to be the reciprocal of the equal current gain $G_{i,eq,VG}$ of the first m−1 stages of the voltage gain network, as given by:

$$G_{i,eq,CG} = \frac{1}{G_{i,eq,VG}}. \quad (13)$$

Finally, using the fact that the product of the current gains of all the voltage gain and current gain network stages equals the total current gain $G_{i,tot}$, the optimal current gain of the first stage of the current gain network is given by:

$$G_{i,1,CG} = \frac{G_{i,tot}}{G_{i,eq,VG}^{m-1} G_{i,m,VG} G_{i,eq,CG}^{n-1}}. \quad (14)$$

The optimal compensation characteristics ($Q_{in}$'s and $Q_{load}$'s) of the m stages of the voltage gain network are related to the optimal equal current gain $G_{i,eq,VG}$ of the first m−1 stages, as:

$$Q_{load,p,VG} = Q_{in,p+1,VG} = -G_{i,eq,VG} \quad \forall\, p \in \{1, 2, \ldots, m-1\}. \quad (15)$$

$$Q_{load,m,VG} = -\frac{G_{i,tot}}{G_{i,eq,VG}^{m-n}}, \quad (16)$$

Similarly, the optimal compensation characteristics of the n stages of the current gain network are related to the optimal equal current gain $G_{i,eq,CG}$ of the last n−1 stages, as:

$$Q_{in,1,CG} = \frac{1}{G_{i,tot} G_{i,eq,CG}^{m-n}}. \quad (17)$$

$$Q_{in,q,CG} = Q_{load,q-1,CG} = \frac{1}{G_{i,eq,CG}} \quad \forall\, q \in \{2, 3, \ldots, n\}. \quad (18)$$

Depending on the number of stages, (11)-(18) can be solved either analytically or numerically to determine the optimal current gains and compensation characteristics of all the stages of the voltage and current gain networks. As an example, closed-form analytical expressions also be determined using (15) and (16) by replacing n with 1. The input impedance characteristic of the single-stage current gain network $Q_{in,1,CG}$ can similarly be obtained from (17) by replacing $G_{i,eq,CG}$ with $$\frac{1}{G_{i,eq,VG}}$$

and setting n=1. Finally, since the output of the single current gain stage is directly interfaced with the rectifier of the capacitive WPT system, its load impedance characteristic $Q_{load1,CG}$ equals zero.

A similar procedure is employed to determine the optimal gains and compensation characteristics in designs having multistage current gain networks (n>1) and single-stage voltage gain networks (m=1). For these designs, the optimization again predicts that the last n−1 stages of the current gain network have equal current gain. This optimal equal current gain $G_{i,eq,CG}$ can be determined using (11) by replacing $G_{i,eq,VG}$ with

TABLE II

EXPRESSIONS FOR OPTIMAL CURRENT GAINS AND COMPENSATION CHARACTERISTICS OF VOLTAGE AND CURRENT GAIN NETWORKS IN A CAPACITIVE WPT SYSTEM WITH TWO-STAGE VOLTAGE GAIN AND CURRENT GAIN NETWORKS

| Number of Stages | Optimal Current Gains and Impedance Characteristics of the Stages |
|---|---|
| m = n = 2 | $G_{i,1,VG} = \sqrt{\dfrac{\left(k_{inv}^2 V_{IN}^2 \dfrac{(1+G_{i,tot}^2)}{4G_{i,tot} P_{OUT}\|X_p\|} + k_{inv} V_{IN}(1+G_{i,tot}^2)\sqrt{4 + k_{inv}^2 V_{IN}^2 \dfrac{1}{4G_{i,tot} P_{OUT}\|X_p\|}}\right)}{2(1+G_{i,tot}^2)}}$, |
|   | $G_{i,2,VG} = \dfrac{\left(k_{inv} V_{IN} \sqrt{\dfrac{(1+G_{i,tot}^2)}{4G_{i,tot} P_{OUT}\|X_p\|}},\right)}{G_{i,1,VG}}$, |
|   | $G_{i,2,CG} = \sqrt{\dfrac{\left(-1 + \sqrt{1 + \dfrac{1}{k_{inv}^2 V_{IN}^2} 4 P_{OUT}\|X_p\| G_{i,tot}}\right)}{2}}$, |
|   | $G_{i,1,CG} = \dfrac{\dfrac{1}{k_{inv} V_{IN}}\sqrt{\dfrac{4 P_{OUT}\|X_p\| G_{i,tot}^3}{(1+G_{i,tot}^2)}}}{G_{i,2,CG}}.$ | for the optimal current gains and compensation characteristics in a capacitive WPT system with two-stage voltage gain and current gain networks are presented in Table II. Using the gains and compensation characteristics obtained from (11)-(18), the inductance and capacitance values for each stage can be determined using (1) and (2).

For designs with multistage voltage gain networks (m>1) and single-stage current gain networks (n=1), the optimization also predicts that the first m−1 stages of the voltage gain network have equal current gain. This optimal equal current gain $G_{i,eq,VG}$, the current gain of the last stage of the voltage gain network $G_{i,m,VG}$, and the current gain of the single-stage current gain network can simply be obtained from (11), (12) and (14), respectively, by setting n=1. The optimal compensation characteristics of the voltage gain stages can $$\frac{1}{G_{i,eq,CG}}$$

and setting m=1. The current gain of the first stage of the current gain network can then be obtained from:

$$G_{i,1,CG} = \frac{2 G_{i,tot}}{k_{inv} V_{IN} G_{i,eq,CG}^{n-1}} \sqrt{|X_p| P_{OUT}\left(\frac{G_{i,eq,CG}^{n-1}}{G_{i,tot}} + \frac{G_{i,tot}}{G_{i,eq,CG}^{n-1}}\right)}. \quad (19)$$

The current gain of the single-stage voltage gain network can be found using:

$$G_{i,1,VG} = \frac{G_{i,tot}}{G_{i,1,CG}G_{i,eq,CG}^{n-1}}. \quad (20)$$

The optimal compensation characteristics of the current gain stages can be determined from (17) and (18) by setting m=1. Since the input of the single-stage voltage gain network is connected to the inverter of the capacitive WPT system, its input impedance characteristic $Q_{in,1,VG}$ is constrained to be zero. The load impedance characteristic of this single-stage network can be obtained from (16) by replacing $G_{i,eq,VG}$ with $$\frac{1}{G_{i,eq,CG}}$$

and setting m=1.

Finally, for designs with single-stage voltage gain and current gain networks (m=n=1), the optimal current gains can be found using (12) and (14), and the optimal compensation characteristics of the two-single-stage networks can be obtained from (16) and (17) by replacing m and n with 1.

Insights from Optimization Results

Figure 4A:
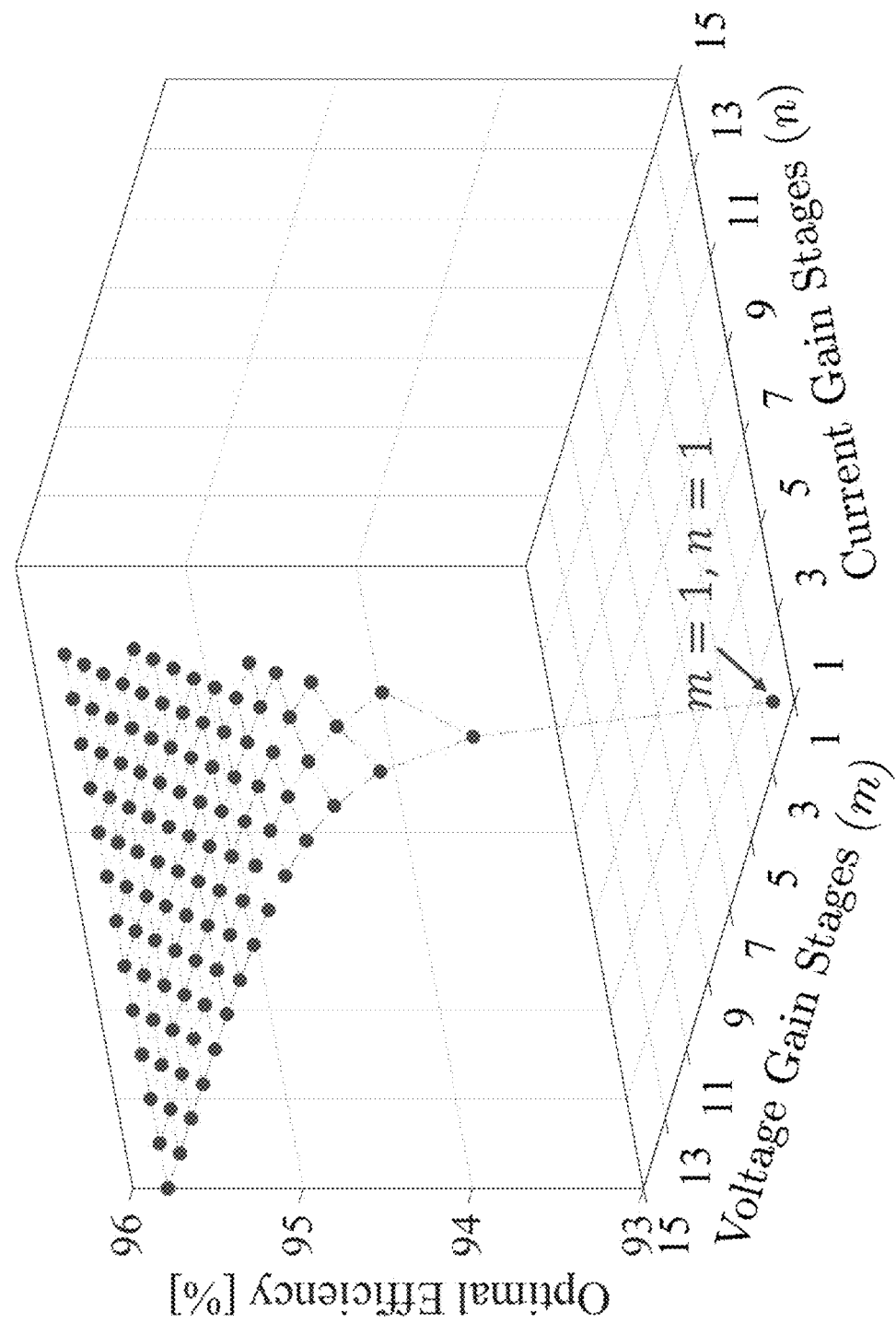
FIGS. 4(a) through 4(c) depict graphs showing optimal matching network efficiency as a function of the number of voltage gain and current gain stages, according to one or more embodiments described and shown herein.
Figure 4B:
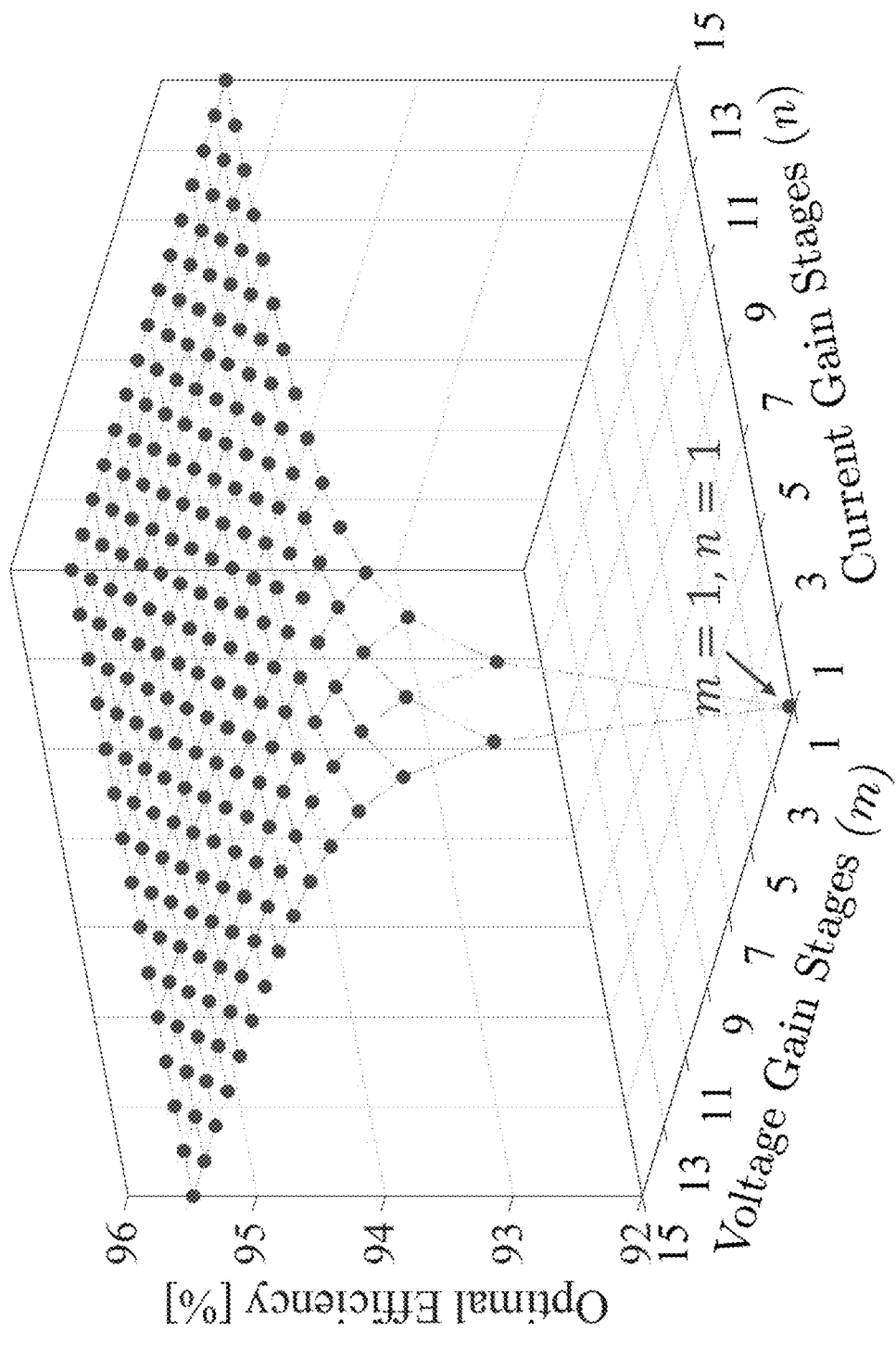

The current gains and compensation characteristics obtained from the above optimization procedure can be used to compute the optimal matching network efficiency for the capacitive WPT system of FIG. 3. This optimal efficiency depends on the dc input voltage $V_{IN}$, the output power $R_{OUT}$, the reactance of the coupling plates $X_p$, the total current gain $G_{i,tot}$ and the number of voltage gain and current gain stages, m and n. The optimal matching network efficiency for a 6.78-MHz capacitive WPT system with an input voltage of 300 V, output power of 2 kW, coupling capacitance $C_p$ of 20 pF (corresponding to a coupling reactance $X_p$ of 1.17 kΩ) is shown as a function of the number of stages in the voltage gain and current gain networks m and n, for three different values of the total current gain $G_{i,tot}$, in FIG. 4. As can be seen, for each value of total current gain, the optimal efficiency increases monotonically with the number of voltage and current gain stages. Furthermore, it can be seen from FIG. 4(a) that for a total current gain of 0.75, there is a maximum number of current gain stages that can be utilized in the efficiency-optimized design. This is because the L-section stages of the current gain network (such as shown in FIG. 2(c)) are suitable for stepping-up current, and can only provide current gains greater than or equal to 1 in the efficiency-optimized designs. To better understand how this translates to a limit on the number of current gain stages, consider FIG. 5(a), which shows the current gain provided by the first stage of the current gain network, $G_{i,1,CG}$, as a function of the number of current gain stages, for a total current gain $G_{i,tot}$ of 0.75, and for various numbers of voltage gain stages. As can be seen, for each number of voltage gain stages m, as the number of current gain stages n is increased, the current gain provided by the first current gain stage monotonically decreases, and finally goes below 1. This translates to the first current gain stage having negative capacitance in its shunt branch; hence, placing a maximum limit on the number of current gain stages, beyond which this current gain stage becomes physically unrealizable. This limit on the number of current gain stages exists for all current gains less than 1, and is given by:

$$n_{max} \mid G_{i,tot} < 1 = \begin{cases} 1 & \text{if } m = 1 \\ \lfloor n_{sol} \rfloor & \text{if } m > 1 \end{cases}, \quad (21a)$$

where $\lfloor . \rfloor$ represents the floor function, and $n_{sol}$ is the solution to the following equation:

$$\left(\frac{4|X_p|P_{OUT}}{k_{inv}^2 V_{IN}^2}\right)^2 G_{i,tot}^{\frac{4m}{m-n+1}} = \left(G_{i,tot}^{\frac{2}{m-n+1}} + 1\right)^2 \left(\frac{4|X_p|P_{OUT}}{k_{inv}^2 V_{IN}^2} G_{i,tot}^{\frac{2m-1}{m-n+1}} - 1\right). \quad (21b)$$

Figure 6A:
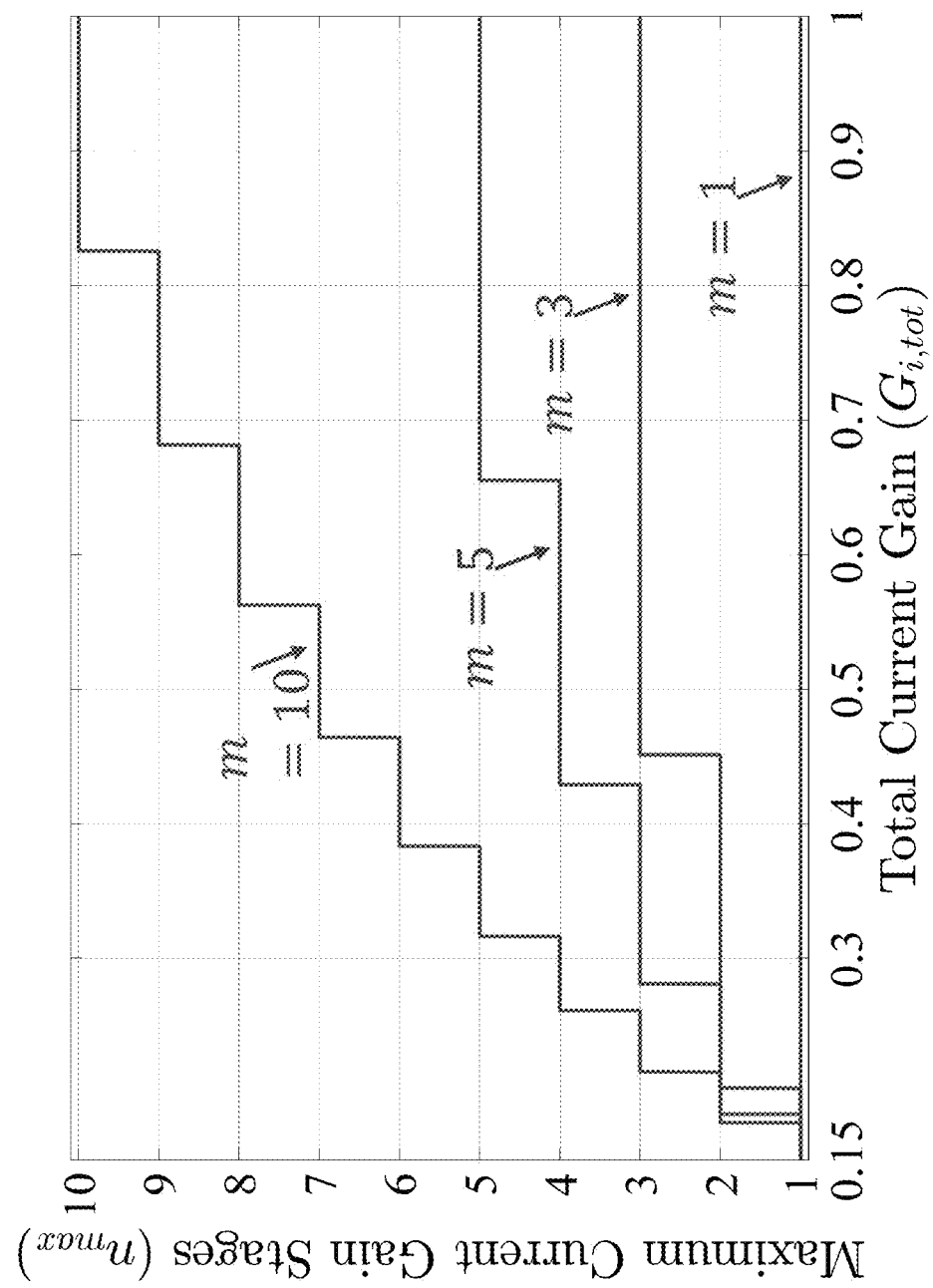
FIGS. 6(a) and 6(b) depicts graphs showing example maximum numbers of current gain stages as a function of a total current gain, according to one or more embodiments described and shown herein.

The maximum number of current gain stages obtained by solving (21) is shown as a function of the total current gain $G_{i,tot}$ in FIG. 6(a), for the same input voltage, output power and coupling reactance as those used above. As mentioned earlier, the matching network efficiency monotonically increases with the number of both the voltage and current gain stages. Therefore, for all values of total current gain $G_{i,tot}$ less than 1, and for any number of voltage gain stages m, the maximum number of current gain stages $n_{max}$ shown in FIG. 6(a) also corresponds to the optimal number of current gain stages.

Figure 4C:
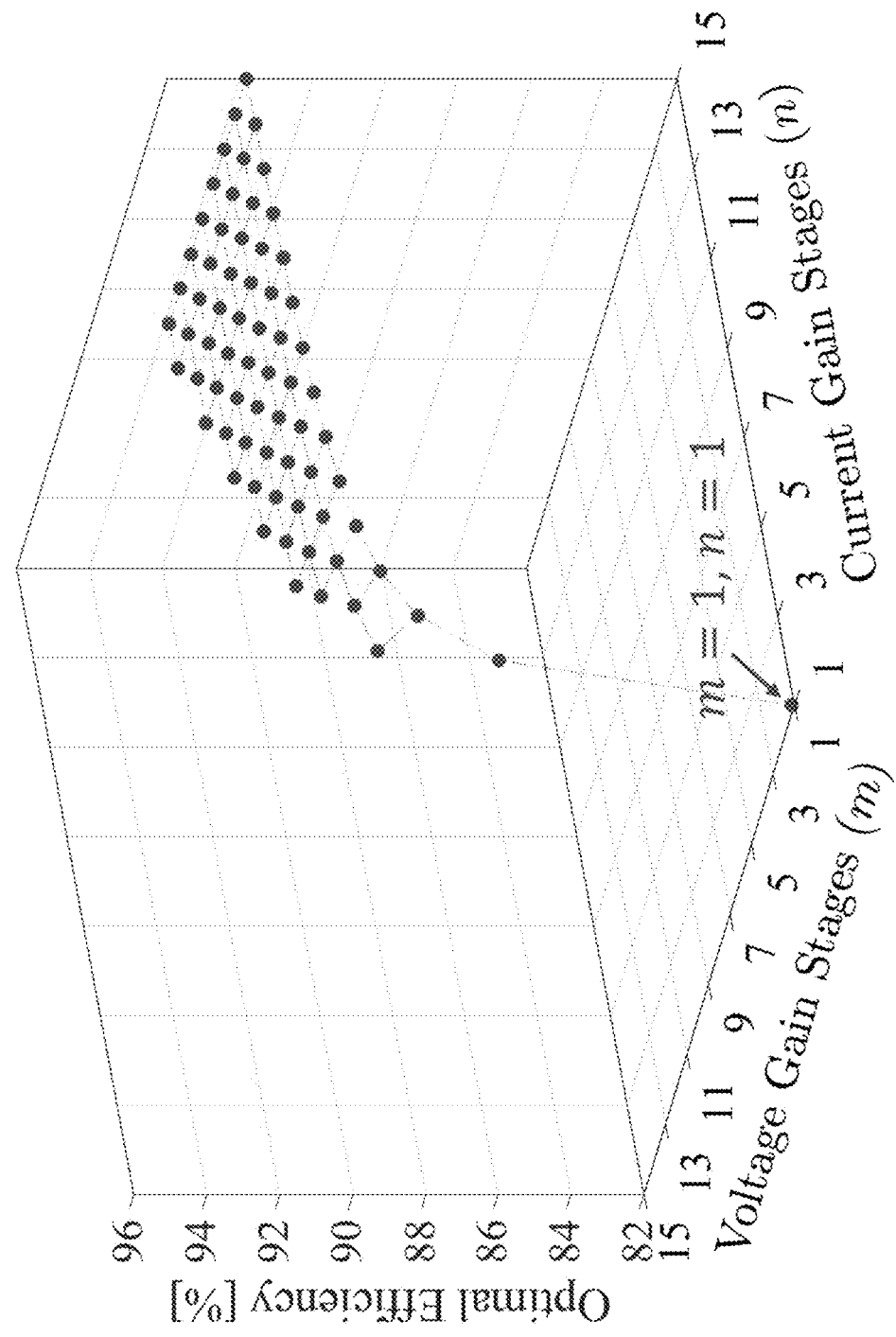
Figure 5A:
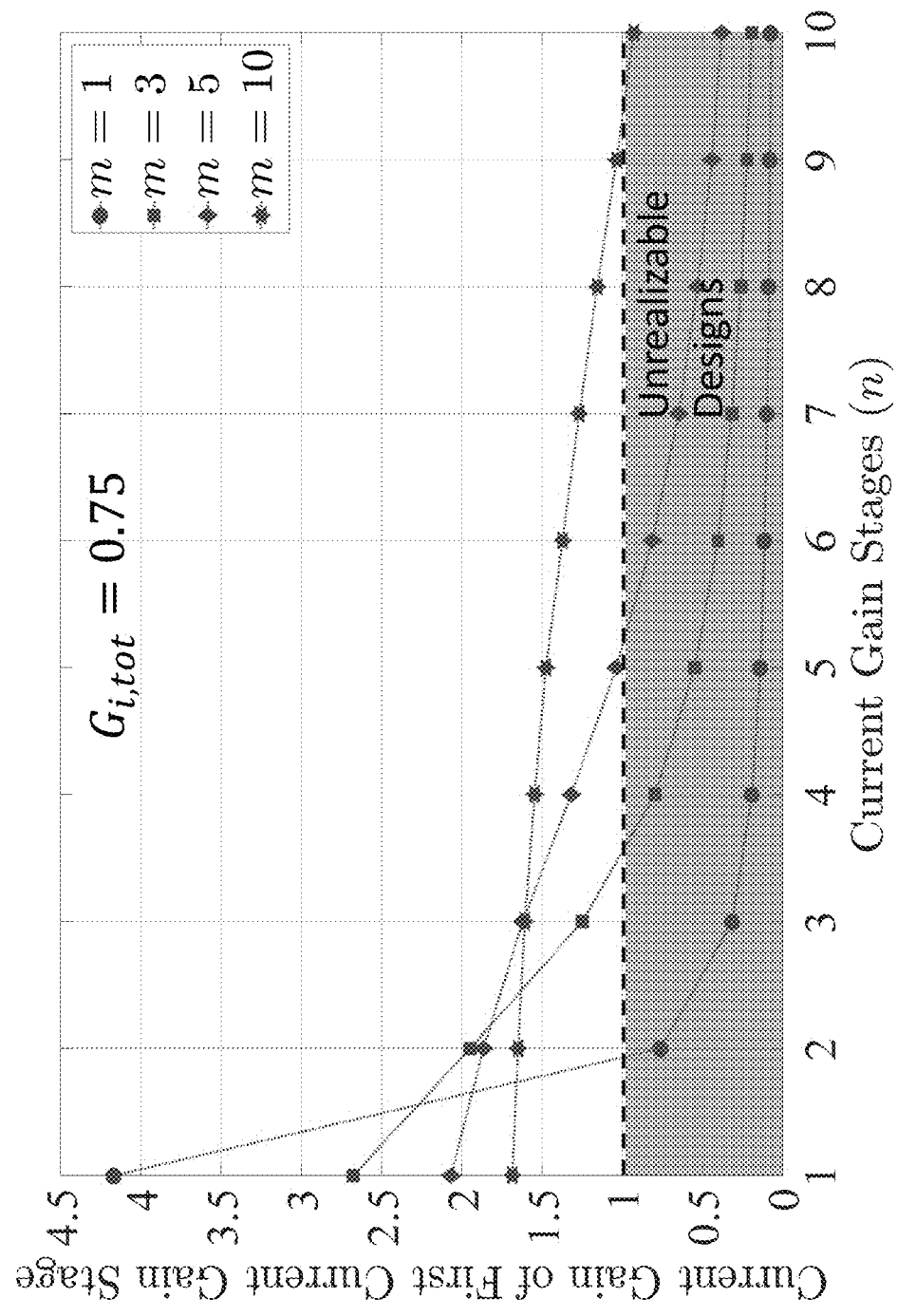
FIG. 5(a) depicts a graph showing current gain provided by a first stage of the current gain network as a function of the number of current gain stages, according to one or more embodiments described and shown herein.
Figure 5B:
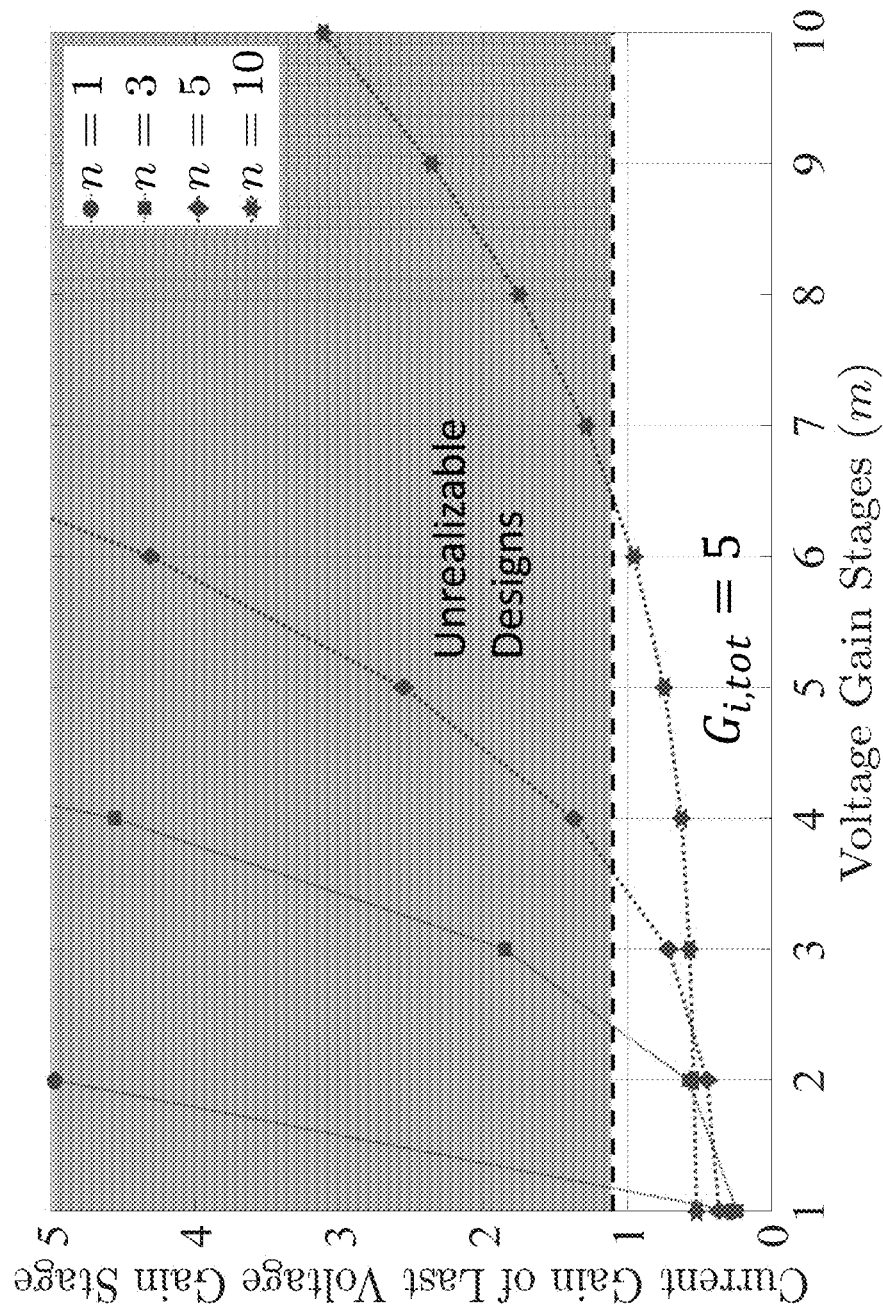
FIG. 5(b) depicts a graph showing current gain provided by a last stage of the current gain network as a function of the number of current gain stages, according to one or more embodiments described and shown herein.

A similar maximum limit exists on the number of voltage gain stages for all total current gains greater than 1, as evident in FIG. 4(c) for a total current gain of 5. For total current gains greater than 1, as the number of stages in the voltage gain network is increased, the current gain provided by its last (m-th) stage monotonically increases and exceeds 1, as shown for $G_{i,tot}=5$ in FIG. 5(b). In order to provide a current gain greater than 1 in the efficiency-optimized design, this voltage gain stage requires a negative capacitance. This renders all such designs unrealizable, and places a maximum limit on the number of voltage gain stages for total current gains greater than 1. This limit is given by:

$$n_{max} \mid G_{i,tot} > 1 = \begin{cases} 1 & \text{if } n = 1 \\ \lfloor m_{sol} \rfloor & \text{if } n > 1 \end{cases}, \quad (22a)$$

where $m_{sol}$ is the solution to the following equation:

$$\left(\frac{4|X_p|P_{OUT}}{k_{inv}^2 V_{IN}^2}\right)^2 G_{i,tot}^{\frac{4m-4}{m-n+1}} = \left(G_{i,tot}^{\frac{2}{m-n+1}} + 1\right)^2 \left(\frac{4|X_p|P_{OUT}}{k_{inv}^2 V_{IN}^2} G_{i,tot}^{\frac{2m-3}{m-n+1}} - 1\right). \quad (22b)$$

Figure 6B:
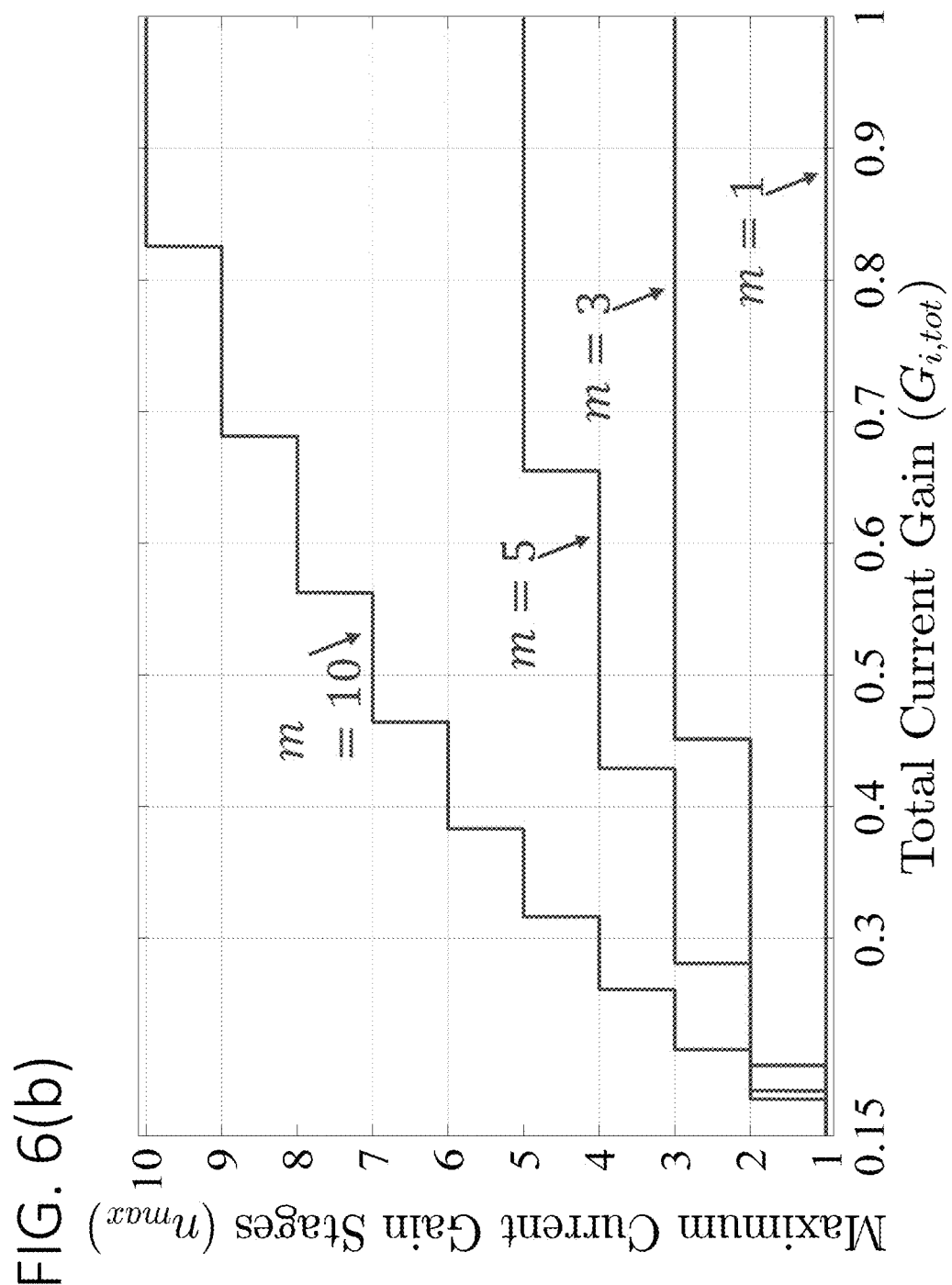

The maximum limit on the number of voltage gain stages obtained by solving (22) is plotted as function of the total current gain $G_{i,tot}$ in FIG. 6(b). Recalling that the matching network efficiency increases monotonically with the number of voltage and current gain stages, for all total current gains greater than 1, and for any number of current gain stages n, the maximum number of voltage gain stages $m_{max}$ shown in FIG. 6(b) also corresponds to the optimal number of voltage gain stages. A derivation of (21) and (22) can be performed based on the optimization results presented above. It is worth noting from FIG. 4(b) that unlike total current gains $G_{i,tot}$ greater than or less than 1, for $G_{i,tot}$ equal to 1, there is no limit on the number of stages that can be utilized in the voltage gain and current gain networks.

FIGS. 4(a)-4(c) depict graphs showing optimal matching network efficiency as a function of the number of voltage gain and current gain stages, for 4(a) total current gain $G_{i,tot}=0.75$, 4(b) $G_{i,tot}=1$, and 4(c) $G_{i,tot}=5$. FIGS. 4(a)-4(c)

reveal another useful insight: although the matching network efficiency increases monotonically with the number of voltage and current gain stages, the efficiency benefit reduces with each additional stage. Furthermore, designs with a very high number of stages may suffer from additional losses due to interconnects, and undesirably increase system size. An effective approach to achieving a favorable tradeoff in this scenario is to limit the total number of stages, m+n. Depending on the required total current gain $G_{i,tot}$, circuit designers can then utilize plots similar to FIG. 4 to find the combination of the number of voltage gain and current gain stages that maximizes the matching network efficiency.

The optimization results of Section III further provide insights into the distribution of compensation between the voltage gain network and current gain network of the capacitive WPT system of FIG. 3. As mentioned earlier, the voltage and current gain networks of the capacitive WPT system together fully compensate the reactance of the coupling plates. The compensation provided by a voltage gain or current gain network can be defined as:

$$\Delta X = X_{in} - X_{load}, \tag{23}$$

where $X_{in}$ is the input reactance and $X_{load}$ is the load reactance of the network, respectively. In the efficiency-optimized designs resulting from the procedure of Section III, the compensations provided by the voltage gain and current gain networks can be expressed, respectively, as:

$$\Delta X_{VG} = \begin{cases} \dfrac{1}{1+G_{i,tot}^2}|X_p| & \text{if } m=1 \text{ and } n=1 \\ \dfrac{G_{i,eq,CG}^{2(n-1)}}{G_{i,eq,CG}^{2(n-1)}+G_{i,tot}^2}|X_p| & \text{if } m=1 \text{ and } n>1 \\ \dfrac{G_{i,eq,VG}^{2(m-n)}}{G_{i,eq,VG}^{2(m-n)}+G_{i,tot}^2}|X_p| & \text{if } m>1 \end{cases} \tag{24a}$$

$$\Delta X_{CG} = \begin{cases} \dfrac{G_{i,tot}^2}{1+G_{i,tot}^2}|X_p| & \text{if } n=1 \text{ and } m=1 \\ \dfrac{G_{i,tot}^2}{G_{i,eq,VG}^{2(m-1)}+G_{i,tot}^2}|X_p| & \text{if } n=1 \text{ and } m>1 \\ \dfrac{G_{i,tot}^2}{G_{i,eq,CG}^{2(n-m)}+G_{i,tot}^2}|X_p| & \text{if } n>1 \end{cases} \tag{24b}$$

Figure 7:
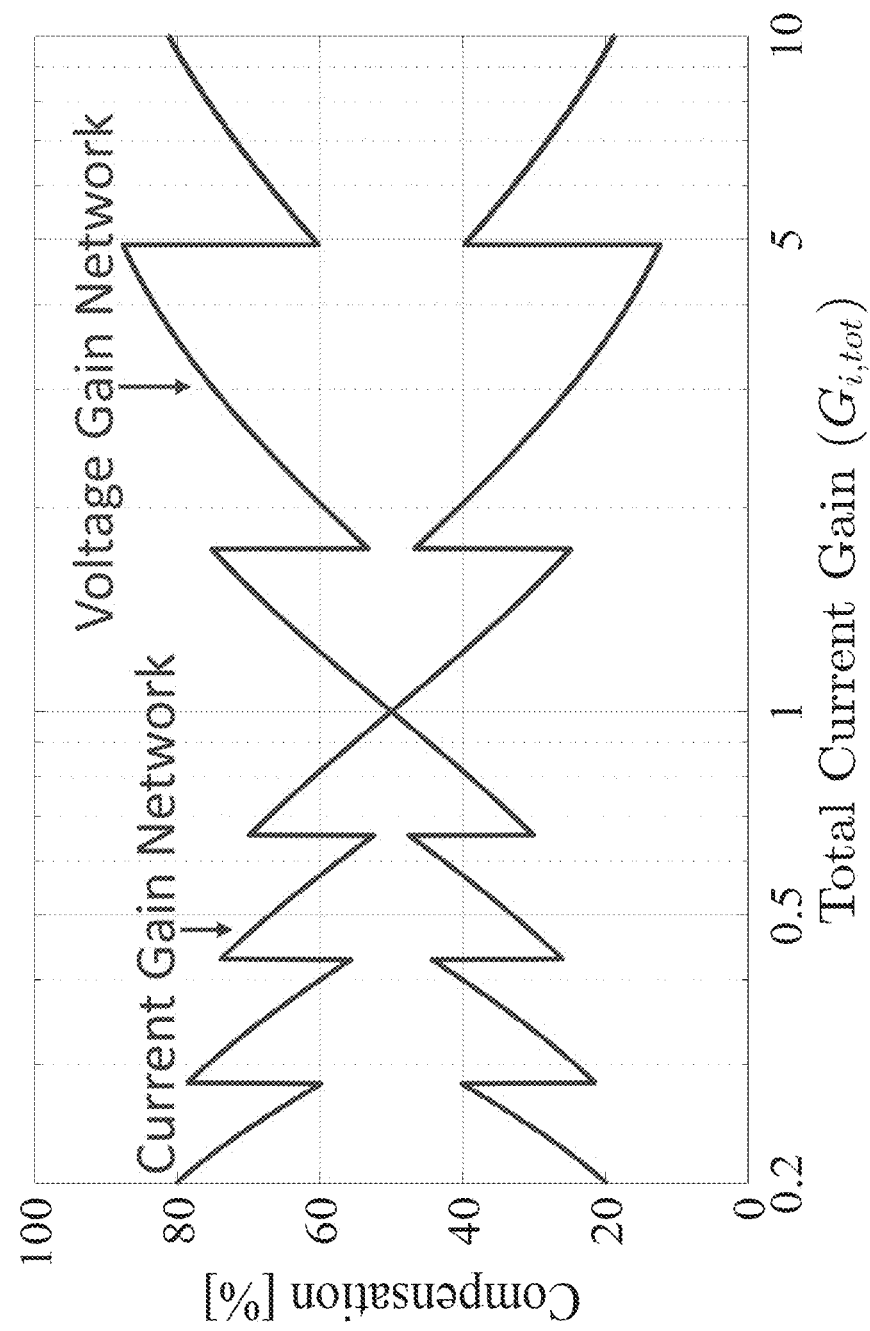
FIG. 7 depicts a graph showing a percentage of total compensation provided by example voltage and current gain networks as a function of a total current gain of a system, according to one or more embodiments described and shown herein.

It can be shown using (24) and (13) that for all combinations of the number of voltage gain and current gain stages, m and n, the total compensation provided by the two networks ($\Delta X_{VG} + \Delta X_{VG}$) is equal in magnitude to the reactance of the coupling plates $|X_p|$. The percentage of the total compensation provided by the voltage and current gain networks is shown as a function of the total current gain of the system $G_{i,tot}$ in FIG. 7, for the same system specifications as those used earlier. For each total current gain $G_{i,tot}$ less than 1 in FIG. 7, the number of voltage gain stages m is selected as 5, while the number of current gain stages n is selected to be at the corresponding maximum (and hence optimum) limit $n_{max}$ as given by the green curve in FIG. 6(a). Similarly, for each total current gain $G_{i,tot}$ greater than 1, the number of current gain stages n is selected to be 5, while the number of voltage gain stages m is selected according to the maximum limit $m_{max}$ given by the green curve in FIG. 6(b). As can be seen from FIG. 7, as the total current gain increases, the compensation provided by the voltage gain network has an upward trend, while that provided by the current gain network has a downward trend.

In a capacitive WPT system, larger compensation corresponds to larger inductors and typically lower efficiencies. Therefore, FIG. 7 indicates that in efficiency-optimized designs, as the voltage gain network provides a progressively larger fraction of the compensation at the cost of reduced efficiency, the current gain network provides a proportionally smaller fraction of the compensation, such that the overall matching network efficiency remains high.

Validation of Analytical Approach Using Numerical Optimization

Figure 8:
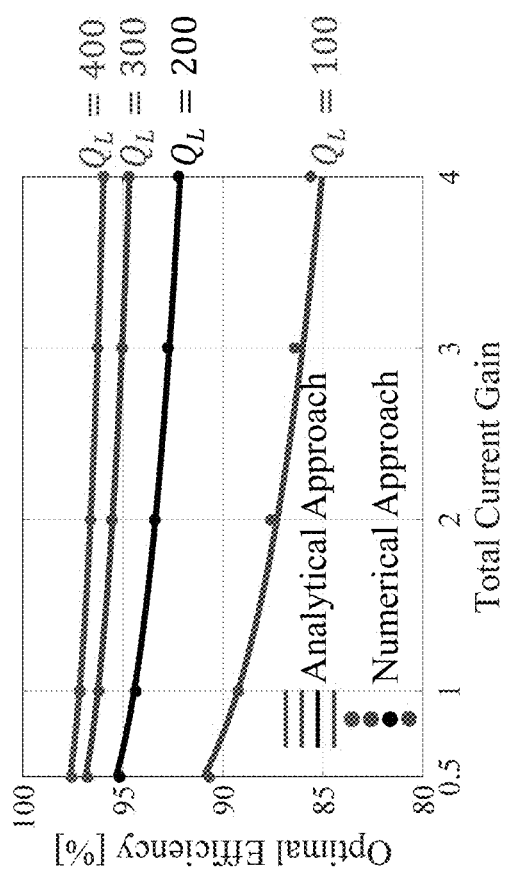
FIG. 8 depicts a graph showing a comparison of an example proposed analytical design approach with an exhaustive-search based numerical approach for 2.2 kW, 6.78-MHz capacitive WPT system with two-stage voltage gain and two-stage current gain network for different inductor quality factors, according to one or more embodiments described and shown herein.

To validate the analytical optimization approach described above, an exhaustive-search based numerical optimization has been performed for a 2-kW, 6.78-MHz capacitive WPT system with 2-stage voltage gain and 2-stage current gain networks, a dc input voltage of 300 V and coupling capacitance $C_p$ of 20 pF. In the numerical search, the gain ($G_b$) and impedance characteristics ($Q_{in}$ and $Q_{load}$) of each stage in both the voltage gain and current gain networks are varied iteratively across wide ranges. In each iteration, the inductance and capacitance values for the L-section stages are computed using (1) and (2), and inductor losses are calculated based on practical quality factors. This amounts to an exhaustive numerical search over the entire design space, and identifies the most efficient matching network design for the given specifications. The efficiencies obtained from this exhaustive optimization are then compared with those of the proposed analytical approach, as shown in FIG. 8 for four different inductor quality factors. It can be seen that the analytically predicted efficiencies are an excellent match with their numerical counterparts.

Comparison Between Proposed Approach and Alternate Approach

To demonstrate the advantages of the proposed design approach, its results are compared with those of an alternate approach to designing matching networks in capacitive WPT systems, given in F. Lu, H. Zhang, H. Hofmann and C. Mi, "A CLLC-compensated high power and large air-gap capacitive power transfer system for electric vehicle charging applications," *Proceedings of the IEEE Applied Power Electronics Conference and Exposition (APEC)*, Long Beach, Calif., March 2016 (herein, Lu et al.)(incorporated by reference herein in its entirety). For this comparison, a capacitive WPT system for electric vehicle charging, for example, that has a topology similar to the one shown in FIG. 3, with a two-stage voltage gain network and a two-stage current gain network (m=n=2) is considered. Here, the proposed approach is compared to the alternate approach for the following system specifications: 270 V dc input voltage and 270 V dc output voltage (corresponding to a total current gain $G_{i,tot}$ of 1), 1.9 kW output power, 1 MHz switching frequency and 11.3 pF equivalent coupling capacitance $$\left(=\dfrac{C_p}{2}\right).$$

Figure 9:
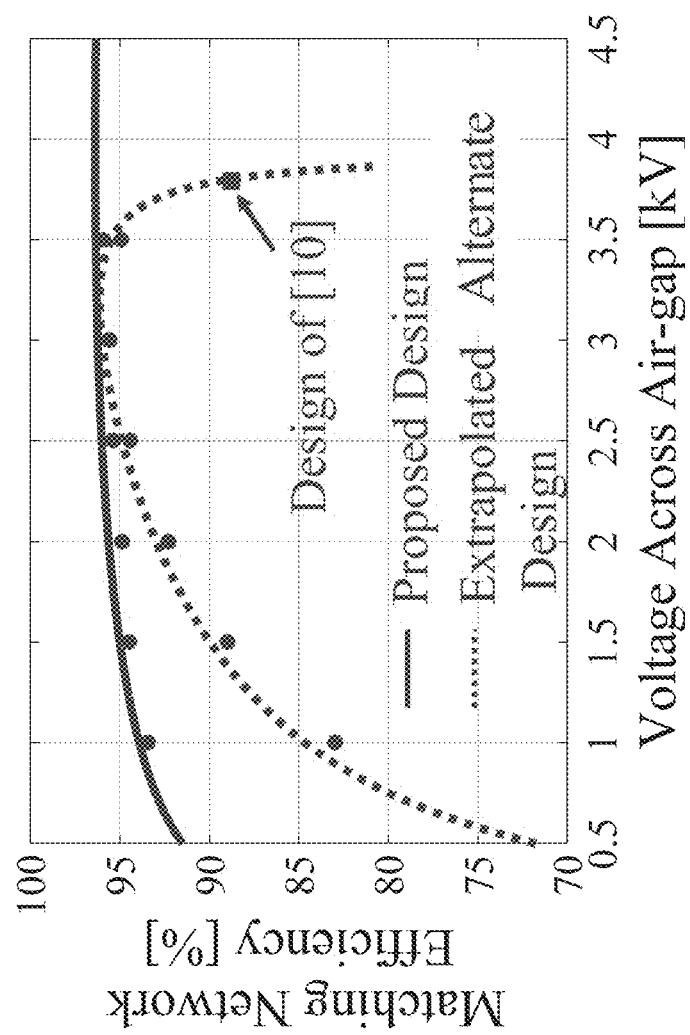
FIG. 9 depicts a graph showing a comparison of an example proposed and alternate design approaches for a 1.9-kW, 1-MHz capacitive WPT system with two-stage voltage gain and two-stage current gain networks, with total current gain $G_{i,tot}=1$ inductor quality factor of 500, according to one or more embodiments described and shown herein.

The alternate approach given in Lu et al. designs the two-stage voltage gain and current gain networks of the capacitive WPT system such that desirable characteristics such as current source behavior at the input and output ports of the system are achieved. This approach comprises five design equations; however, since there are a total of eight inductance and capacitance values to select, three of these can be independently determined. Here, three of the inductance and capacitance values are numerically selected so as to maximize the matching network efficiency while satisfying the design equations of Lu et al. The matching network efficiencies predicted by this extrapolated alternate design approach are then compared with those predicted by the proposed approach, for a total current gain $G_{i,tot}$ of 1, over a range of voltages across the air-gap of the capacitive WPT system, as shown in FIG. 9. The green square marker in FIG. 9 corresponds to the actual matching network design presented in Lu et al., while the dashed red curve represents the extrapolation of the alternate approach. As can be seen, the proposed approach, represented by the solid blue curve, results in significantly improved efficiencies over the entire range of air-gap voltages. For instance, compared to the 87% efficiency of the actual design in Lu et al., the proposed design approach predicts 96.3% efficiency for the same air-gap voltage, corresponding to a 71% reduction in losses. Furthermore, to achieve the same efficiency, the proposed approach requires a lower voltage across the air-gap. For example, to achieve 90% efficiency, while the extrapolated alternate approach requires an air-gap voltage of 1.8 kV, the proposed approach requires an air-gap voltage of 550 V—around 69% lower. Therefore, the proposed approach is well-suited to safety-sensitive capacitive WPT systems in which low air-gap voltages, and hence low fringing fields, are highly desirable. FIG. 9 also shows LTSpice-simulated efficiencies for both the proposed and alternate designs, superimposed on the analytical curves as solid circular markers. It can be seen that the simulated efficiencies match the predicted efficiencies for both the proposed and the alternate designs fairly accurately.

Experimental Validation

Figure 10:
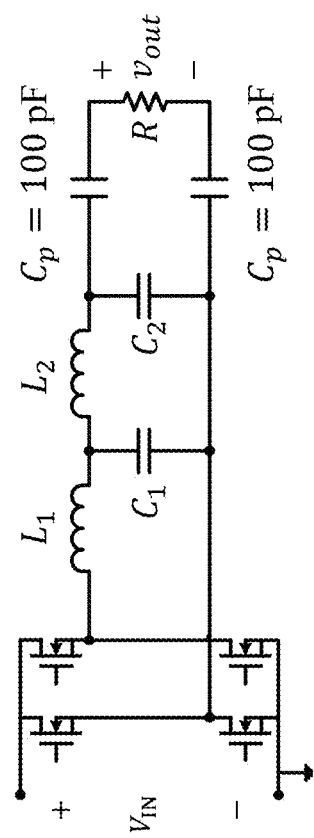
FIG. 10 shows a schematic diagram of an example voltage gain network test circuit comprising two cascaded L-section stages, according to one or more embodiments described and shown herein.

To further validate the efficiency predictions of the proposed design approach, a voltage gain network comprising two cascaded L-section stages of the type shown in FIG. 2(a) is designed, built and tested. The schematic of the test circuit is shown in FIG. 10; it comprises a full-bridge inverter feeding the two-stage L-section network, followed by two capacitors and a load resistor in series. Each of the two capacitors shown as $C_p$ in FIG. 10 are 100 pF in value, and emulate two conductive plates of approximately 0.1 m² area kept 1 cm apart in air. Thus, this test circuit emulates a capacitive wireless power transfer system with coupling plates of 0.1 m² area separated by a 1-cm air-gap, and a two-stage L-section voltage gain network. The voltage-gain matching network in this system is designed for an operating frequency of 6.78 MHz and a total current gain of 0.1, and the inductance and capacitance values are determined using the analytical optimization approach introduced in this patent. The inductance and capacitance values for the two L-section stages are listed in Table III. The load resistance is 4 kΩ, resulting in an output power of approximately 15 W.

Figure 11A:
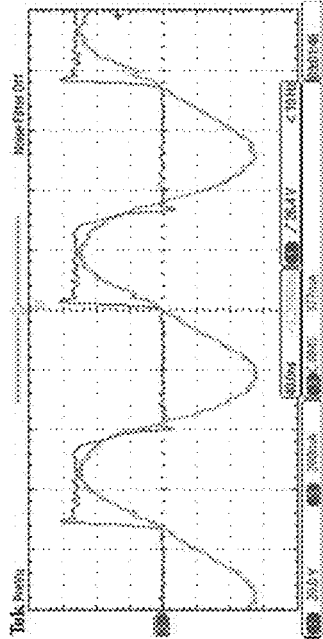
FIG. 11(a) depicts a graph showing measured switch node voltage of an inverter and input current of a matching network, according to one or more embodiments described and shown herein.
Figure 11B:
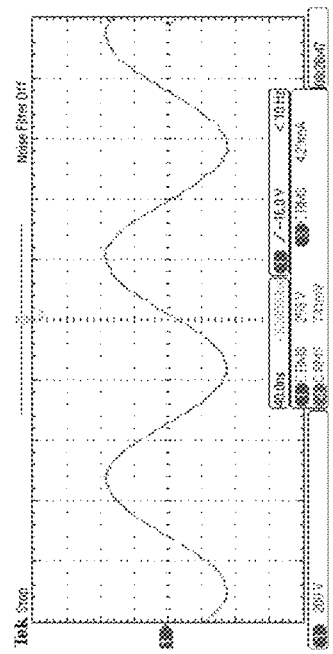
FIG. 11(b) depicts a graph showing an output voltage across a load resistor, according to one or more embodiments described and shown herein.

The measured switch node voltage of the inverter and the input current of the matching network are shown in FIG. 11(a), and the output voltage across the load resistor is shown in FIG. 11(b). As can be seen, the matching network appears near-resistive to the inverter. The built inductors have different quality factors: $L_1$ has a quality factor of 100.2 and $L_2$ has a quality factor of 267.1. Therefore, the efficiency of each individual voltage gain stage is calculated analytically using the inductor quality factor corresponding to that stage. The analytically calculated efficiency of the two-stage matching network is 96%. The input power to the matching network and the output power across the load are measured to determine the matching network efficiency. Based on these measurements, the matching network is 94.3% efficient, which matches well with the analytically predicted efficiency.

Although implementations have been described above with a certain degree of particularity, those skilled in the art could make numerous alterations to the disclosed embodiments without departing from the spirit or scope of this invention. All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A matching network comprising at least one of:
   a first stage providing an input stage of the matching network, the first stage comprising a pair of matching network input terminals, a pair of first stage output terminals, and at least two first stage reactive components disposed between the pair of matching network input terminals and the pair of first stage output terminals, the first stage comprising a near-resistive input impedance and a complex load impedance; and
   a second stage providing an output stage of the matching network, the second stage comprising a pair of second stage input terminals coupled to the pair of first stage output terminals, a pair of matching network output terminals, and at least two second stage reactive components disposed between the pair of second stage input terminals and the pair of matching network output terminals, the second stage comprising a complex input impedance and a complex load impedance.

2. The matching network of claim 1 wherein the pair of second stage input terminals is coupled to the pair of first stage output terminals via at least one series connected intermediate stages.

3. The matching network of claim 1 wherein a third stage providing an intermediate stage of the matching network comprises a pair of third stage input terminals coupled to the first stage output terminals, a pair of third stage output terminals coupled to the pair of second stage input terminals, and at least two third stage reactive components disposed between the pair of third stage input terminals and the pair of third stage output terminals, the third stage comprising a complex input impedance, wherein the first stage, second stage, and third stage are coupled in series.

4. The matching network of claim 1 wherein the at least two reactive components of the first stage comprise a first reactive component disposed in series between a first terminal of the pair of matching network input terminals and a first terminal of the pair of first stage output terminals and a second reactive component disposed between the first terminal of the pair of matching network input terminals and a second terminal of the pair of matching network input terminals.

5. The matching network of claim 1 wherein the at least two reactive components of the first stage comprise a first reactive component disposed in series between a first terminal of the pair of matching network input terminals and a first terminal of the pair of first stage output terminals and a second reactive component disposed between the first terminal of the pair of first stage output terminals and a second terminal of the pair of first stage output terminals.

6. The matching network of claim 1 wherein the at least three reactive components comprise a Pi(π) reactive network.

7. The matching network of claim 1 wherein the at least three reactive components comprise a T reactive network.

8. The matching network of claim 1 wherein the at least two reactive components of the first stage comprise at least one capacitor and at least one inductor.

9. The matching network of claim 1 wherein the at least two reactive components of the second stage comprise at least one capacitor and at least one inductor.

10. The matching network of claim 1 wherein the values of the reactive components L and C are determined according to the following:

$$L = \frac{\left(G_i\sqrt{(1-G_i^2)+Q_{load}^2} + G_i^2 Q_{in}\right)R_{load}}{2\pi f_s} \text{ and}$$

$$C = \frac{1 - G_i^2}{2\pi f_s\left(G_i\sqrt{(1-G_i^2)+Q_{load}^2} - G_i^2 Q_{load}\right)R_{load}}.$$

11. The matching network of claim 1 wherein the values of the reactive components L and C are determined according to the following:

$$L = \frac{\left(G_i\sqrt{(1-G_i^2)+Q_{load}^2} + G_i^2 Q_{load}\right)R_{load}}{2\pi f_s(1-G_i^2)} \text{ and}$$

$$C = \frac{1}{2\pi f_s\left(G_i\sqrt{(1-G_i^2)+Q_{load}^2} - G_i^2 Q_{in}\right)R_{load}}.$$

12. A matching network comprising at least one of:
a first stage providing an input stage of the matching network, the first stage comprising a pair of matching network input terminals, a pair of first stage output terminals, and at least two first stage reactive components disposed between the pair of matching network input terminals and the pair of first stage output terminals, the first stage comprising a complex input impedance and a complex load impedance; and
a second stage providing an output stage of the matching network, the second stage comprising a pair of second stage input terminals coupled to the pair of first stage output terminals, a pair of matching network output terminals, and at least two second stage reactive components disposed between the pair of second stage input terminals and the pair of matching network output terminals, the second stage comprising a complex input impedance and a near-resistive load impedance.

13. The matching network of claim 12 wherein the pair of second stage input terminals is coupled to the pair of first stage output terminals via at least one series connected intermediate stages.

14. The matching network of claim 12 wherein a third stage providing an intermediate stage of the matching network comprises a pair of third stage input terminals coupled to the first stage output terminals, a pair of third stage output terminals coupled to the pair of second stage input terminals, and at least two third stage reactive components disposed between the pair of third stage input terminals and the pair of third stage output terminals, the third stage comprising a complex input impedance, wherein the first stage, second stage, and third stage are coupled in series.

15. The matching network of claim 12 wherein the at least two reactive components of the first stage comprise a first reactive component disposed in series between a first terminal of the pair of matching network input terminals and a first terminal of the pair of first stage output terminals and a second reactive component disposed between the first terminal of the pair of matching network input terminals and a second terminal of the pair of matching network input terminals.

16. The matching network of claim 13 wherein the at least two reactive components of the first stage comprise a first reactive component disposed in series between a first terminal of the pair of matching network input terminals and a first terminal of the pair of first stage output terminals and a second reactive component disposed between the first terminal of the pair of first stage output terminals and a second terminal of the pair of first stage output terminals.

17. The matching network of claim 12 wherein the at least two reactive components of the first stage comprise at least one capacitor and at least one inductor.

18. The matching network of claim 12 wherein the at least two reactive components of the second stage comprise at least one capacitor and at least one inductor.

19. The matching network of claim 12 wherein the values of the reactive components L and C are determined according to at least one of the following:

$$L = \frac{\left(\sqrt{(G_i^2-1)+G_i^2 Q_{in}^2} - Q_{load}\right)R_{load}}{2\pi f_s} \text{ and}$$

$$C = \frac{1 - \frac{1}{G_i^2}}{2\pi f_s\left(\sqrt{(G_i^2-1)+G_i^2 Q_{in}^2} + Q_{in}\right)R_{load}}.$$

20. The matching network of claim 12 wherein the values of the reactive components L and C are determined according to at least one of the following:

$$L = \frac{\left(\sqrt{(G_i^2-1)+G_i^2 Q_{in}^2} - Q_{in}\right)R_{load}}{2\pi f_s\left(1 - \frac{1}{G_i^2}\right)} \text{ and}$$

$$C = \frac{1}{2\pi f_s\left(\sqrt{(G_i^2-1)+G_i^2 Q_{in}^2} + Q_{load}\right)R_{load}}.$$

21. A wireless power transfer system comprising:
a wireless power transfer (WPT) circuit comprising a WPT primary side and a WPT secondary side;
a first matching network comprising a first matching network input port and a first matching network output port, the first matching network output port coupled to the WPT primary side, wherein the first matching network comprises at least one of:
a first stage comprising a near-resistive input impedance and a complex load impedance, and a second stage comprising a complex input impedance and a complex load impedance at the first matching output port; and a second matching network comprising a second matching network input port and a second matching network output port, the second matching network input port coupled to the WPT secondary side, wherein the second matching network comprises at least one of:

a first stage comprising a complex input impedance, and a second stage comprising a complex input impedance and a near-resistive load impedance at the second matching output port.

22. The wireless power transfer system of claim 21 wherein the WPT circuit comprises at least one of a capacitive coupling and an inductive coupling.

23. The wireless power transfer system of claim 21 wherein the first matching network comprises the first stage, the second stage and a third stage providing an intermediate stage of the first matching network, the third stage comprising a pair of third stage input terminals coupled to a pair of first stage output terminals, a pair of third stage output terminals coupled to a pair of second stage input terminals, and at least two third stage reactive components disposed between the pair of third stage input terminals and the pair of third stage output terminals, wherein an intermediate input impedance of the first matching network comprises at least one of the input impedance of the second stage and an input impedance of the third stage and the intermediate input impedance is complex.

24. The wireless power transfer system of claim 21 wherein the second matching network comprises the first stage, the second stage and a third stage providing an intermediate stage of the second matching network, the third stage comprising a pair of third stage input terminals coupled to a pair of first stage output terminals, a pair of third stage output terminals coupled to a pair of second stage input terminals, and at least two third stage reactive components disposed between the pair of third stage input terminals and the pair of third stage output terminals, wherein an intermediate input impedance of the second matching network comprises at least one of the input impedance of the second stage and an input impedance of the third stage and the intermediate input impedance is complex.

* * * * *